(12) United States Patent
Schwartz et al.

(10) Patent No.: US 10,106,643 B2
(45) Date of Patent: Oct. 23, 2018

(54) DUAL-CURE NANOSTRUCTURE TRANSFER FILM

(71) Applicant: 3M INNOVATIVE PROPERTIES COMPANY, St. Paul, MN (US)

(72) Inventors: Evan L. Schwartz, Vadnais Heights, MN (US); Claire Hartmann-Thompson, St. Paul, MN (US); Shijing Cheng, Woodbury, MN (US); Nicholas C. Erickson, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/674,819

(22) Filed: Mar. 31, 2015

(65) Prior Publication Data

US 2016/0288450 A1    Oct. 6, 2016

(51) Int. Cl.
*C08G 59/17*    (2006.01)
*C08J 3/24*    (2006.01)
(Continued)

(52) U.S. Cl.
CPC ............ *C08G 59/1466* (2013.01); *B32B 3/28* (2013.01); *B32B 3/30* (2013.01); *B32B 7/06* (2013.01); *B32B 7/12* (2013.01); *B32B 27/08* (2013.01); *B32B 27/26* (2013.01); *B32B 27/308* (2013.01); *B32B 27/36* (2013.01); *B32B 27/38* (2013.01); *C08G 59/14* (2013.01); *C08J 3/243* (2013.01); *C08J 3/244* (2013.01); *H01L 51/56* (2013.01); *B32B 2255/10* (2013.01); *B32B 2255/20* (2013.01); *B32B 2255/26* (2013.01); *B32B 2307/412* (2013.01); *B32B 2307/538* (2013.01); *B32B 2405/00* (2013.01);
(Continued)

(58) Field of Classification Search
CPC .............. C08G 59/1466; B32B 37/025; Y10T 428/24521–428/24554
USPC .................................................. 428/161–165
See application file for complete search history.

(56) References Cited

U.S. PATENT DOCUMENTS 3,018,262 A    1/1962  Schroeder
3,117,099 A    1/1964  Proops
(Continued)

FOREIGN PATENT DOCUMENTS

CN         102643591       6/2014
EP          109581         5/1984
(Continued)

OTHER PUBLICATIONS

Cook et al., Effect of curing order on the curing kinetics and morphology of bisGMA/DGEBA interpenetrating polymer networks, Polymer International, 2006, p. 1027-1039.*
(Continued)

*Primary Examiner* — Z. Jim Yang
(74) *Attorney, Agent, or Firm* — Jonathan L. Tolstedt

(57) ABSTRACT

A transfer film includes a template layer having a first major surface and an opposing second major surface. The second major surface includes a structured non-planar release surface. A backfill layer is disposed upon and conforms to the non-planar structured surface. The backfill layer includes a first cross-linked polymer and a plurality of multifunctional monomers, which cure via different and independent curing mechanisms.

15 Claims, 2 Drawing Sheets

(51) Int. Cl.
  *C08G 59/14* (2006.01)
  *B32B 3/28* (2006.01)
  *B32B 27/38* (2006.01)
  *H01L 51/56* (2006.01)
  *B32B 7/06* (2006.01)
  *B32B 7/12* (2006.01)
  *B32B 27/08* (2006.01)
  *B32B 27/26* (2006.01)
  *B32B 27/30* (2006.01)
  *B32B 27/36* (2006.01)
  *B32B 3/30* (2006.01)

(52) U.S. Cl.
  CPC ........ *B32B 2451/00* (2013.01); *B32B 2457/12* (2013.01); *B32B 2457/206* (2013.01); *B32B 2551/00* (2013.01)

(56) References Cited

U.S. PATENT DOCUMENTS

| | | | |
|---|---|---|---|
| 4,472,480 A | 9/1984 | Olson | |
| 4,567,073 A | 1/1986 | Larson | |
| 4,614,667 A | 9/1986 | Larson | |
| 4,735,632 A | 4/1988 | Oxman | |
| 4,751,138 A | 6/1988 | Tumey | |
| 4,948,449 A | 8/1990 | Tarbutton | |
| 4,985,340 A | 1/1991 | Palazzotto | |
| 5,252,694 A | 10/1993 | Willett | |
| 5,560,796 A | 10/1996 | Yoshimura | |
| 5,639,811 A * | 6/1997 | Plamthottam | B32B 7/10 524/272 |
| 5,679,719 A * | 10/1997 | Klemarczyk | C08F 283/10 427/501 |
| 5,714,218 A | 2/1998 | Nishio | |
| 5,721,289 A | 2/1998 | Karim | |
| 5,897,727 A * | 4/1999 | Staral | B32B 37/12 156/151 |
| 6,187,836 B1 * | 2/2001 | Oxman | A61K 6/0017 522/100 |
| 6,306,555 B1 * | 10/2001 | Schulz | C07C 17/00 430/270.1 |
| 6,329,058 B1 | 12/2001 | Arney | |
| 6,366,013 B1 | 4/2002 | Leenders | |
| 6,396,079 B1 | 5/2002 | Hayashi | |
| 6,521,324 B1 | 2/2003 | Debe | |
| 6,858,253 B2 | 2/2005 | Williams | |
| 7,384,809 B2 | 6/2008 | Donofrio | |
| 9,246,134 B2 | 1/2016 | Schwartz | |
| 9,472,788 B2 | 10/2016 | Collier | |
| 2003/0129438 A1 * | 7/2003 | Becker | C08G 59/4042 428/620 |
| 2003/0192638 A1 * | 10/2003 | Yang | B32B 7/12 156/230 |
| 2003/0216514 A1 * | 11/2003 | Nishikubo | C08F 20/28 525/108 |
| 2003/0219992 A1 | 11/2003 | Schaper | |
| 2004/0087687 A1 * | 5/2004 | Yang | C08G 59/1466 523/451 |
| 2005/0112500 A1 | 5/2005 | Nishikubo | |
| 2005/0118352 A1 | 6/2005 | Suwa | |
| 2005/0227031 A1 | 10/2005 | Yang | |
| 2005/0276916 A1 | 12/2005 | Yang | |
| 2006/0270806 A1 | 11/2006 | Hale | |
| 2007/0042174 A1 | 2/2007 | Rao | |
| 2008/0142158 A1 * | 6/2008 | Dershem | C07C 69/003 156/330 |
| 2008/0213541 A1 * | 9/2008 | Schilling | B44C 1/00 428/161 |
| 2009/0015142 A1 | 1/2009 | Potts | |
| 2009/0061159 A1 * | 3/2009 | Staub | G03H 1/26 428/161 |
| 2009/0256287 A1 | 10/2009 | Fu | |
| 2009/0322219 A1 | 12/2009 | Wolk | |
| 2009/0324870 A1 * | 12/2009 | Ito | C08G 59/1466 428/65.1 |
| 2010/0006211 A1 | 1/2010 | Wolk | |
| 2010/0015408 A1 * | 1/2010 | Fong | B22C 7/02 428/195.1 |
| 2010/0104807 A1 * | 4/2010 | Chiu | B44C 1/17 428/142 |
| 2010/0151207 A1 | 6/2010 | Hansen | |
| 2010/0160577 A1 | 6/2010 | Hirano | |
| 2010/0200157 A1 | 8/2010 | Kimura | |
| 2010/0300611 A1 * | 12/2010 | Yamamoto | B32B 7/06 156/248 |
| 2010/0323924 A1 * | 12/2010 | Li | C08B 37/0021 506/33 |
| 2011/0182805 A1 | 7/2011 | DeSimone | |
| 2011/0278772 A1 | 11/2011 | Inamiya | |
| 2011/0305787 A1 | 12/2011 | Ishii | |
| 2011/0311807 A1 * | 12/2011 | Jin | C08J 7/047 428/336 |
| 2012/0099323 A1 | 4/2012 | Thompson | |
| 2012/0142807 A1 * | 6/2012 | Jin | A61K 6/0017 522/65 |
| 2012/0168074 A1 * | 7/2012 | Kim | C09D 133/06 156/306.6 |
| 2012/0171484 A1 * | 7/2012 | Ko | C08K 5/3412 428/355 EP |
| 2013/0102698 A1 * | 4/2013 | Leon | C08G 59/08 522/18 |
| 2013/0319522 A1 | 12/2013 | Kioke | |
| 2013/0327479 A1 * | 12/2013 | Ichino | C08J 5/24 156/307.3 |
| 2014/0018472 A1 * | 1/2014 | Sulzbach | C08G 59/1466 523/436 |
| 2014/0021492 A1 | 1/2014 | Wolk | |
| 2014/0175707 A1 | 6/2014 | Wolk | |
| 2014/0178646 A1 | 6/2014 | Wolk | |
| 2014/0238580 A1 * | 8/2014 | Zhang | C09J 163/00 156/99 |
| 2014/0242343 A1 | 8/2014 | Free | |
| 2015/0044509 A1 * | 2/2015 | Kunimoto | C09D 11/02 428/704 |
| 2015/0118454 A1 | 4/2015 | Kwon | |
| 2015/0144932 A1 * | 5/2015 | Bae | H01L 51/5253 257/40 |
| 2015/0177434 A1 * | 6/2015 | Kunikata | G02B 5/305 428/522 |
| 2015/0202834 A1 | 7/2015 | Free | |
| 2015/0328913 A1 * | 11/2015 | Sakamoto | B41M 5/42 428/32.5 |
| 2016/0096316 A1 | 4/2016 | Wolk | |
| 2016/0104851 A1 | 4/2016 | Wolk | |
| 2016/0280846 A1 * | 9/2016 | Karunakaran | C08J 3/243 |
| 2016/0298008 A1 * | 10/2016 | Tasaka | C08F 220/10 |
| 2016/0333634 A1 | 11/2016 | Free | |
| 2017/0226256 A1 * | 8/2017 | O'Kane | C08F 290/064 |
| 2017/0275427 A1 * | 9/2017 | Shafi | C08J 5/04 |

FOREIGN PATENT DOCUMENTS

| | | | |
|---|---|---|---|
| EP | 306161 | 3/1989 | |
| EP | 306162 | 3/1989 | |
| EP | 1507837 | 2/2005 | |
| JP | 2005119022 | 5/2005 | |
| JP | 2005-186347 | 7/2005 | |
| JP | 2007-245684 | 9/2007 | |
| JP | 2009-220351 | 10/2009 | |
| JP | 2011104804 | 6/2011 | |
| JP | WO 2013129415 A1 * | 9/2013 | ........ B41M 5/38257 |
| JP | 2013216804 A * | 10/2013 | ........... G03F 7/0007 |
| WO | WO 03/102102 | 12/2003 | |
| WO | WO 2008-118610 | 10/2008 | |
| WO | WO 2011-088161 | 7/2011 | |
| WO | WO 2012-077738 | 6/2012 | |
| WO | WO 2012/082536 | 6/2012 | |
| WO | WO-2013032190 A1 * | 3/2013 | ........... G03F 7/0007 |
| WO | WO 2013156509 A2 * | 10/2013 | ............ C09D 11/02 |
| WO | WO 2015-040113 | 3/2015 | |

(56) References Cited

FOREIGN PATENT DOCUMENTS

| WO | WO 2015/069444 | 5/2015 | |
|---|---|---|---|
| WO | WO 2015-108773 | 7/2015 | |
| WO | WO 2015-112711 | 7/2015 | |
| WO | WO-2015186717 A1 * | 12/2015 | ............. C03C 17/32 |

OTHER PUBLICATIONS

Chen et al., Curing kinetics and morphology of IPNs from a flexible dimethacrylate and a rigid epoxy via sequential photo and thermal polymerization, European Polymer Jounral, 2008, p. 1796-1813.*

Vabrik et al., A Study of Epoxy Resin—Acrylated Polyurethane Semi-Interpenetrating Polymer Networks, Journal of Applied Polymer Sciences, vol. 68, 1998, p. 111-119.*

Kagawa et al., Preparation and Properties of IPN Materials Containing Bisphenol A Acrylate and an Epoxide Hybrid Unit, Designed Monomers and Polymers, vol. 12, 2009, p. 497-510.*

Nowers et al., The effect of interpenetrating polymer network formation on polymerization kinetics in an epoxy-acrylate system, Polymer, vol. 47, 2006, p. 1108-1118.*

Brook, Silicon in Organic, Organometallic and Polymer Chemistry, 282-291, (2000).

Cannistra, "Micro-Transfer molding of SU-8 micro-optics," 2008, vol. 6883, No. 0277-786X, pp. 68830C-1-9.

Kim, "Effects of the substrate pretreatments on the leakage current in the low-temperature poly-si TFTs," Materials Research Society, 1997, vol. 448, pp. 419-423.

Kondoh, "Surface treatment of sheet glass. Present status and future prospects," Journal of Non-Crystalline Solids, 1994, vol. 178, pp. 189-198.

Kress, Classification of Digital Optics, Applied Digital Optics, 2009, Chapter 2, pp. 15-20.

Saxena, "A review on the light extraction techniques in organic electroluminescent devices," Optical Materials, 2009, vol. 32, pp. 221-233.

International Search Report PCT/US2016/024190—dated Jun. 6, 2016.

U.S. Appl. No. 15/257,099, filed Sep. 6, 2016.
U.S. Appl. No. 15/270,627, filed Sep. 20, 2016.
U.S. Appl. No. 14/674,779, filed Mar. 31, 2015.

* cited by examiner

DUAL-CURE NANOSTRUCTURE TRANSFER FILM

BACKGROUND

Nanostructures and microstructures on glass substrates are used for a variety of applications in display, lighting, architecture and photovoltaic devices, for example. In display devices the structures can be used for light extraction or light distribution. In lighting devices the structures can be used for light extraction, light distribution, and decorative effects. In photovoltaic devices the structures can be used for solar concentration and antireflection. Patterning or otherwise forming nanostructures and microstructures on large glass substrates can be difficult and cost-ineffective.

Lamination transfer methods that use a structured backfill layer inside a nanostructured sacrificial template layer as a lithographic etch mask have been disclosed. The backfill layer can be a glass-like material. However, these methods require removing the sacrificial template layer from the backfill layer while leaving the structured surface of the backfill layer substantially intact. The sacrificial template layer is typically removed by a dry etching process using oxygen plasma, a thermal decomposition process, or a dissolution process.

SUMMARY

The present disclosure relates to dual-cure structured transfer film. The structured transfer film is partially cured to form a stable, tacky film. This tacky film is laminated onto a receptor substrate and fully cured to impart stable nanostructure and/or microstructure to the receptor substrate. The structured transfer film is formed by a curing one of a first multifunctional monomer or a second multifunctional monomer. The structured transfer film is laminated to a receptor substrate and then the other multifunctional monomer is cured to form an interpenetrating network. The first multifunctional monomer is cured with a one of, a free-radical or cationic cure mechanism, and the second multifunctional monomer is cured with a one of, a free-radical or cationic cure mechanism, that is different than and independent of the first multifunctional monomer cure mechanism.

In one aspect, a transfer film includes a template layer having a first major surface and an opposing second major surface. The second major surface includes a structured non-planar release surface. A backfill layer is disposed upon and conforms to the non-planar structured surface. The backfill layer includes a cross-linked epoxy polymer, a plurality of multifunctional acrylate monomers, and a molecule having acrylate and epoxy functionalities.

In another aspect, a transfer film includes a template layer having a first major surface and an opposing second major surface. The second major surface includes a structured non-planar release surface. A backfill layer is disposed upon and conforms to the non-planar structured surface. The backfill layer includes a cross-linked acrylate polymer, a plurality of multifunctional epoxy monomers, and a molecule having acrylate and epoxy functionalities.

In another aspect, an article includes a transfer film, as described herein, disposed on a receptor substrate.

In a further aspect, an article includes a receptor substrate having a receptor surface and a light transmission layer having a first major surface adhered to the receptor surface and an opposing second major surface having a structured non-planar surface. The light transmission layer includes an interpenetrating network of a cross-linked epoxy polymer and a cross-linked acrylate polymer and a plurality of compatibilizer molecules having an acrylate group bonded to the cross-linked acrylate polymer and an epoxy group bonded to the cross-linked epoxy polymer. The light transmission layer having a haze value of less than 2% and a visible light transmission greater than 85% and a decomposition temperature greater than 200 degrees centigrade.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
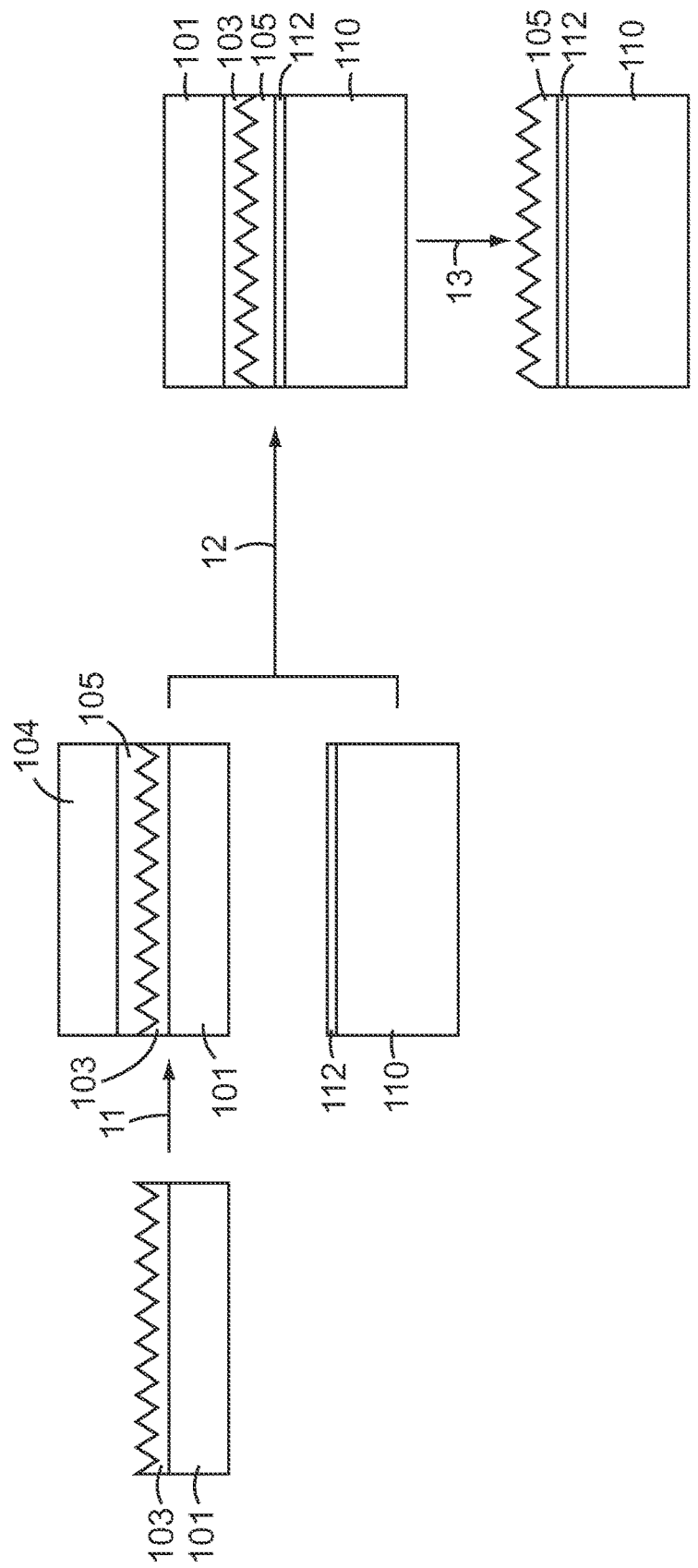
FIG. 1 is a schematic diagram of a process of making the dual-cure transfer tape and structured receptor substrate.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

In this disclosure:

"curing" refers to cross-linking functional groups of proximate monomers or polymers;

"actinic radiation" refers to wavelengths of radiation that can cure polymers and can include ultraviolet, visible, and infrared wavelengths and can include digital exposures from rastered lasers, thermal digital imaging, and electron beam scanning;

"AMOLED" refers to active matrix organic light-emitting diode;

"LED" refers to a light-emitting diode;

"microstructures" refers to structures that range from about 0.1 µm to about 1000 µm in their longest dimension. In this disclosure, the ranges of nanostructures and microstructures necessarily overlay;

"nanostructures" refers to features that range from about 1 nm to about 1000 nm in their longest dimension.

The present disclosure relates to dual-cure structured transfer film. The structured transfer film is partially cured to form a stable, tacky film. This tacky film is laminated onto a receptor substrate and fully cured to impart stable nanostructure and/or microstructure to the receptor substrate. The transfer film utilizes a dual-curable resin formulation coated on the topography of a structured liner. The first curing stage of the resin forms a stable, tacky film that takes the shape of the inverse pattern of the structured liner, having a planar top surface that can be covered with a release liner for transport and subsequent lamination. The planar surface of the tacky film can be laminated and cured against a receptor substrate to fully cure the resin and enhance adhesion to the receptor substrate, then the structured liner can be removed to leave behind a structure (nanostructure and/or microstructure) on the receptor substrate. The resulting structure is thermally stable (has a thermal decomposition temperature of greater than 100 degrees centigrade or greater than 200 degrees centigrade or greater than 250 degrees centigrade) and has excellent resistance to solvents due to the interpenetrating and inter-reacted polymer network. The first cure mechanism is different than and independent of the second cure mechanism. In many embodiments the first cure type is a cationic cure mechanism and the second cure mechanism is a free-radical cure mechanism. In other embodiments, the first cure mechanism is a free-radical cure mechanism and the second sure mechanism is a cationic cure mechanism. One embodiment includes a thermal cationic first stage cure and then an actinic radiation (UV) free-radical cure to fully cure the laminated structure to the substrate. The dual-curable resin formulation includes an epoxy component, an acrylate component and a compatibilizer molecule that includes epoxy and acrylate functionalities. The epoxy component can be a multi-functional molecule and the acrylate component can be a multi-functional molecule. The transfer film and the resulting structure (light transmission layer) on the substrate has a haze value that is less than 2% or less than 1% and a visible light transmission that is greater than 85%. While the present disclosure is not so limited, an appreciation of various aspects of the disclosure will be gained through a discussion of the examples provided below.

Structured lamination transfer films and methods are disclosed that enable the fabrication of structured solid surfaces using lamination. The methods involve replication of a film, layer, or coating in order to form a structured template layer (also referred to as "structured non-planar template layer"). The replication can be performed against a master using any microreplication techniques known to those of ordinary skill in the art of microreplication. These techniques can include, for example, embossing, cast and cure of a prepolymer resin (using thermal or photochemical initiation), or hot melt extrusion. Typically microreplication involves casting of a photocurable prepolymer solution against a template followed by photopolymerization of the prepolymer solution. In this disclosure, "nanostructured" refers to structures that have features that are less than 1 µm, less than 750 nm, less than 500 nm, less than 250 nm, 100 nm, less than 50 nm, less than 10 nm, or even less than 5 nm. "Microstructured" refers to structures that have features that are less than 1000 µm, less than 100 µm, less than 50 µm, or even less than 5 µm. Hierarchical refers to structures with more than one size scale include microstructures with nanostructures (e.g. a microlens with nanoscale moth eye antireflection features). Lamination transfer films have been disclosed, for example, in Applicants' pending published application, US 2014/0021492, entitled "STRUCTURED LAMINATION TRANSFER FILMS AND METHODS".

FIG. 1 is a schematic diagram of a process of making the dual-cure transfer tape and structured receptor substrate. A structured non-planar template layer 103 is formed or disposed on a carrier 101, as described above. The structured non-planar template layer 103 includes a release surface that, in many embodiments, is a thin layer of release coating (not shown) deposited by, for example, plasma enhanced chemical vapor deposition. In some embodiments, release properties may be inherent to the structured template layer.

The resulting structure is then coated with an uncured backfill composition 105. The uncured backfill composition 105 intimately contacts the structured non-planar template layer 103. The backfill composition includes multi-functional epoxy monomers, multifunctional acrylate monomers, and a compatibilizing molecule having acrylate and epoxy functionalities. In many embodiments, the backfill composition is at least 95% wt monomer and compatibilizing molecule or at least 98% wt monomer and compatibilizing molecule or substantially monomer and compatibilizing molecule.

The multi-functional epoxy monomers, multifunctional acrylate monomers have different and independent curing mechanisms. Thus, the uncured backfill composition can include a cationic initiator and a free-radical initiator. In one example, the multi-functional epoxy monomers have a cationic curing mechanism, and the multifunctional acrylate monomers have an independent free-radical curing mechanism.

In one embodiment, the multifunctional acrylate monomers have a photo free-radical (via UV light and a radical photoinitiator) curing mechanism and the multi-functional epoxy monomers have a cationic thermal (via heat and a thermal acid generator) curing mechanism. In another embodiment, the multifunctional acrylate monomers have a thermal free-radical (via heat and a thermal acid generator) curing mechanism and the multi-functional epoxy monomers have a photo-cationic (via UV light and a radical photoinitiator) curing mechanism.

Three stages are associated with the formation of the final film article. Stage A (or A-Stage) is defined as the starting formulation in which no or negligible cure has occurred. Stage B (or B-Stage) is defined as the state in which the first of the two sets of curable groups has cured to an extent sufficient to give a film capable of functioning as a pressure sensitive adhesive at the required surface (partial cure). Stage C (or C-Stage) is defined as the state in which the second of the two sets of curable groups has cured to an extent that the film maintains the template pattern and releases from the template (full cure).

In illustrative embodiments, the transfer film is formed by curing the multifunctional epoxy monomers to form a cross-linked epoxy polymer with the multifunctional acrylate monomers dispersed therein. This partially cured (or b-stage) film has an elastic modulus value that is less than $0.3 \times 10^5$ Pa which provides a pressure-sensitive adhesive-like tack to a variety of surfaces that is stable over time. In addition this partially cured (or b-stage) film has good wet-out and adhesion to the structured non-planar template layer 103.

The partially cured (or b-stage) film should have a modulus value that is no more than Dahlquist Criterion ($0.3 \times 10^5$ Pa or $3 \times 10^6$ dynes/cm$^2$ at room temperature when measured at a frequency of about 1 Hz), which provides a pressure-sensitive adhesive-like tack to a variety of surfaces that is stable over time. This is a criterion for tack and has been given the name "Dahlquist criterion for tack" after the scientist who studied this phenomenon (see Dahlquist, C. A., in Adhesion Fundamentals and Practice, The Ministry of Technology (1966) McLaren and Sons, Ltd., London). Above this modulus, adhesive failure occurs as observed from the small strains at separation.

In other illustrative embodiments, the transfer film is formed by curing the multifunctional acrylate monomers to form a cross-linked acrylate polymer with the multifunctional epoxy monomers dispersed therein. This partially cured (or b-stage) film has an elastic modulus value that close to the above mentioned Dahlquist criterion at the processing temperature of 60° C. which provides a pressure-sensitive adhesive-like tack to a variety of surfaces that is stable over time. Additionally, the b-staged film has a glass transition temperature at or below room temperature to help "wet-out" of the film onto the receptor substrate. In addition this partially cured (or b-stage) film has some adhesion to the structured non-planar template layer 103.

In many embodiments, the partially cured (or b-stage) film has a haze value of less than 2% or less than 1% and a visible light transmission of greater than 85% or greater than 90%. In many embodiments, the partially cured (or b-stage) film has a glass transition temperature of less than 30 degrees centigrade or less than 25 degrees centigrade or less than 20 degrees centigrade.

Once the stable partially cured (or b-stage) film is formed, an optional release liner 104 can be applied to the stable partially cured (or b-stage) film for protection during transport and subsequent processing. The release liner 104 can be disposed on onto a planar major surface of the backfill layer 105 where the backfill layer 105 separates the release liner 104 from the structured non-planar release surface 103. The optional release liner 104 is removed from the stable partially cured (or b-stage) film before the transfer film is laminated onto the receptor substrate 110.

The receptor substrate 110 can be optionally coated with an adhesion promotion layer 112 to aid in the adhesion of the stable partially cured (or b-stage) film and resulting fully cured structured light transmission layer. The adhesion promotion layer 112 can be formed in any useful manner such as, spin coating, dip coating, spraying, plasma polymerization or via other deposition processes.

The stable partially cured (or b-stage) film is laminated onto a receptor substrate 110. This laminated film is cured to crosslink the remaining multifunctional monomers and form interpenetrating cross-linked polymer networks defining a fully cured structured layer. The fully cured structured layer can then release from the structured non-planar template layer 103.

Figure 2:
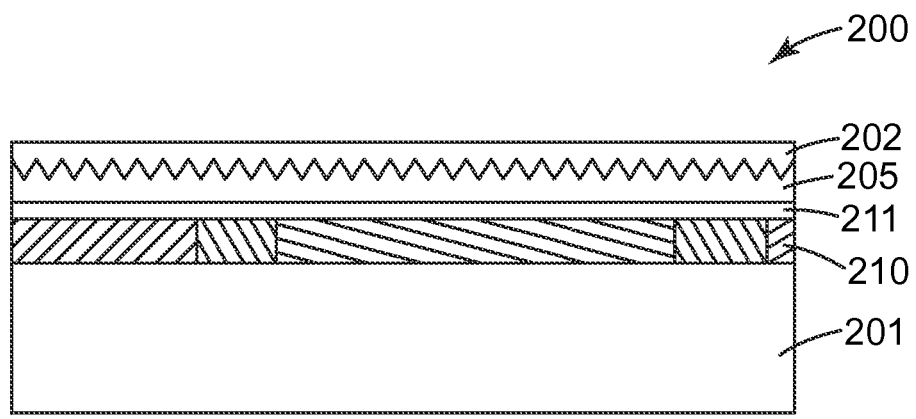
FIG. 2 is a schematic diagram of an illustrative OLED device.

FIG. 2 is a schematic diagram of an illustrative OLED device 200 color filter layer 210. The backfill layer 205 (partially or cully cured) can be disposed on or coupled to the color filter layer 210. One or more layers, such as a planarization layer 211, can couple the color filter layer 210 to the backfill layer 205 (partially or cully cured). A glass substrate 201 can be coupled to the opposing side of the color filter layer 210. A high refractive index layer 202 (e.g., R.I. greater than 1.6) can be disposed on the structured surface of the backfill layer 205 (partially or cully cured). The functional layers of the OLED are not illustrated but it is understood that these layers can be adjacent to either side of the illustrative OLED device 200 layers illustrated.

The fully cured structured layer has a haze value of less than 2% or less than 1% and a visible light transmission greater than 85% or greater than 90% and a glass transition temperature greater than 150 degrees centigrade or greater than 200 degrees centigrade or greater than 250 degrees centigrade. The fully cured structured layer can be referred to as a "structured light transmission layer" and be stable at temperatures of 100 degrees centigrade or greater, or be stable at temperatures of 150 degrees centigrade or greater, or be stable at temperatures of 200 degrees centigrade or greater, or be stable at temperatures of 250 degrees centigrade or greater, for at least 10 minutes. The fully cured structured layer can be solvent stable and resistant to IPA, MEK, toluene, heptane, methoxypropanol, and other solvents. The fully cured structured layer can be mechanically stable for example able to withstand 10 min of sonication in water and/or IPA. The fully cured structured layer can have a visible light refractive index of about 1.5±0.1.

In some embodiments, the epoxy monomers are first cured to form the transfer film and then the acrylate monomers are cured to form a cross-linked acrylate polymer interpenetrating the cross-linked epoxy polymer defining a fully cured structured layer. In some of these embodiments, the cross-linked epoxy polymer was cured (b-stage) via a cationic mechanism and the multifunctional acrylate monomers are cured (c-stage) via a free-radical mechanism.

In other embodiments, the acrylate monomers are first cured to form the transfer film and then the epoxy monomers are cured to form a cross-linked epoxy polymer interpenetrating the cross-linked acrylate polymer defining a fully cured structured layer. In other embodiments, the cross-linked acrylate polymer was cured (b-stage) via a free-radical mechanism and the multifunctional epoxy monomers are cured (c-stage) via a cationic mechanism.

In many embodiments, a plurality of compatibilizer molecules having an acrylate group bonded to the cross-linked acrylate polymer and an epoxy group bonded to the cross-linked epoxy polymer are present in the fully cured structured layer.

Multifunctional Acrylate Monomers

A "polyfunctional acrylate" or "multifunctional acrylate" component can be the reaction product of aliphatic polyhydroxy compounds and (meth)acrylic acids.

(Meth)acrylic acids are unsaturated carboxylic acids which include, for example, those represented by the following basic formula:

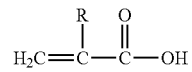

where R is a hydrogen atom or a methyl group.

Polyfunctional (i.e., multifunctional) acrylates can be a monomer or an oligomer. The term "monomer" refers to a small (low-molecular-weight) molecule with a capability of forming chemical bonds with the same or other monomers in such manner that long chains (polymeric chains or macromolecules) are formed. The term "oligomer" refers to a polymer molecule having 2 to 10 repeating units (e.g., dimer, trimer, tetramer, and so forth) having a capability of forming chemical bonds with the same or other oligomers in such manner that longer polymeric chains can be formed therefrom. Mixtures of monomers and oligomers also could be used as the polyfunctional acrylate component. It is preferred that the polyfunctional acrylate component be monomeric.

Representative polyfunctional acrylate monomers include, by way of example and not limitation: ethylene glycol diacrylate, ethylene glycol dimethacrylate, hexanediol diacrylate, triethylene glycol diacrylate, trimethylolpropane triacrylate, ethoxylated trimethylolpropane triacrylate, glycerol triacrylate, pentaerthyitol triacrylate, pentaerythritol trimethacrylate, pentaerythritol tetraacrylate, pentaerythritol tetramethacrylate, and neopentylglycol diacrylate. Mixtures and combinations of different types of such polyfunctional acrylates also can be used. The term "acrylate", as used herein, encompasses acrylates and methacrylates.

Useful commercially available polyfunctional acrylates include a trimethylolpropane triacrylate having the trade designation "SR351," an ethoxylated trimethylolpropane triacrylate having the trade designation "SR454," a pentaerythritol tetraacrylate having the trade designation "SR295," a cyclohexane dimethanol diacrylate having the trade designation "CD406," a tricyclodecane dimethanol diacrylate having the trade designation "SR833S" and a neopentylglycol diacrylate having the trade designation "SR247," and all of these being commercially available from Sartomer Co., Exton, Pa.

The polyfunctional acrylate monomers cure quickly into a network due to the multiple functionalities available on each monomer. If there is only one acrylate functionality, a linear, non-networked molecule will result upon cure of the material. Polyfunctional acrylates having a functionality of two or more are preferred in this invention to encourage and promote the desired polymeric network formation.

The backfill layer or light transmitting layer can have any useful amount of polyfunctional acrylate. In many embodiments the backfill layer or light transmitting layer has 40 to 90% wt polyfunctional acrylate. In some embodiments the backfill layer or light transmitting layer has 60 to 80% wt polyfunctional acrylate.

Multifunctional Epoxy Monomers

Useful epoxy resins include any organic compounds having at least one oxirane ring, i.e.,

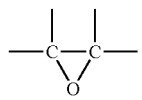

polymerizable by a ring opening reaction. Such materials, broadly called epoxides, include both monomeric and oligomeric epoxides and can be aliphatic, cycloaliphatic, or aromatic. They can be liquid or solid or blends thereof. These materials generally have, on the average, at least two epoxy groups per molecule (preferably more than two epoxy groups per molecule). The polymeric epoxides include linear polymers having terminal epoxy groups (e.g., a diglycidyl ether of a polyoxyalkylene glycol), polymers having skeletal oxirane units (e.g., polybutadiene polyepoxide), and polymers having pendent epoxy groups (e.g., a glycidyl methacrylate polymer or copolymer).

Useful epoxy resins include those which contain cyclohexene oxide groups such as the epoxycyclohexanecarboxylates, typified by 3,4-epoxycyclohexylmethyl-3,4-epoxycyclohexane carboxylate, 3,4-epoxy-2-methylcyclohexylmethyl-3,4-epoxy-2-methycyclohexane carboxylate, and bis(3,4-epoxy-6-methylcyclohexylmethyl) adipate. For a more detailed list of useful epoxides of this nature, reference may be made to U.S. Pat. No. 3,117,099, incorporated herein by reference.

Further epoxy resins which are particularly useful include glycidyl ether monomers of the formula:

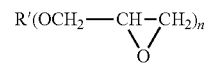

where R' is alkyl or aryl and n is an integer of 2 to 6. Examples are the glycidyl ethers of polyhydric phenols obtained by reacting a polyhydric phenol with an excess of chlorohydrin such as epichlorohydrin, e.g., the diglycidyl ether of 2,2-bis-2,3-epoxypropoxyphenol propane. Further examples of epoxides of this type which can be used in the practice of this invention are described in U.S. Pat. No. 3,018,262, incorporated herein by reference.

There is a host of commercially available epoxy resins which can be useful. In particular, epoxides which are readily available include octadecylene oxide, epichlorohydrin, styrene oxide, vinyl cyclohexene oxide, glycidol, glycidyl-methacrylate, diglycidyl ether of Bisphenol A (e.g., those available under the trade designations "EPON 828," "EPON 1004," and "EPON 1001F" from Shell Chemical Co., and "DER-332" and "DER-334," from Dow Chemical Co.), diglycidyl ether of Bisphenol F (e.g., "ARALDITE GY281" from Ciba-Geigy), vinylcyclohexene dioxide (e.g., having the trade designation "ERL 4206" from Union Carbide Corp.), 3,4-epoxycyclohexyl-methyl-3,4-epoxycyclohexene carboxylate (e.g., having the trade designation "ERL-4221" from Union Carbide Corp.), 2-(3,4-epoxycyclo-hexyl-5,5-spiro-3,4-epoxy)cyclohexane-metadioxane (e.g., having the trade designation "ERL4234" from Union Carbide Corp.), bis(3,4-epoxy-cyclohexyl) adipate (e.g., having the trade designation "ERL-4299" from Union Carbide Corp.), dipentene dioxide (e.g., having the trade designation "ERL4269" from Union Carbide Corp.), epoxidized polybutadiene (e.g., having the trade designation "OXIRON 2001" from FMC Corp.), silicone resin containing epoxy functionality, epoxy silanes, e.g., beta-3,4-epoxy-cyclohexylethyltri-methoxy silane and gamma-glycidoxypropyltrimethoxy silane, commercially available from Union Carbide, flame retardant epoxy resins (e.g., having the trade designation "DER-542," a brominated bisphenol type epoxy resin available from Dow Chemical Co.), 1,4-butanediol diglycidyl ether (e.g., having the trade designation "ARALDITE RD-2" from Ciba-Geigy), hydrogenated bisphenol A-epichlorohydrin based epoxy resins (e.g. having the trade designation "EPONEX 1510" from Shell Chemical Co.), and polyglycidyl ether of phenol-formaldehyde novolak (e.g., having the trade designation "DEN-431" and "DEN-438" from Dow Chemical Co.).

In some embodiments, the ureas are selected from bis-substituted ureas. In some embodiments, the imidazoles are selected from 1-N substituted-, 2-C substituted-imidazoles, and metal imidazolate salts as described in U.S. Pat. No. 4,948,449, having a melting point greater than 200° C. Suitable curatives are commercially available under the trade designations CUREZOL 2PHZ-S, CUREZOL 2MZ- AZINE, and CUREZOL 2MA-OK from Air Products and Chemicals; under the trade designation ARADUR 3123 from Huntsman Advanced Materials; and under the trade designation OMICURE U-35 and OMICURE U-52 from CVC Thermoset Specialties. To achieve fast curing, both an initiator and an activator are generally required. When a two-part system is formulated, one part will contain an initiator and the other part an activator.

Activators that can be used consist of tertiary amines, amine/aldehyde (or ketone) condensates, mercapto compounds, or transition metal compounds. Examples of useful tertiary amines are: N,N-dimethylaniline, N,N-diethylaniline, N,N-dimethyl-p-toluidine, N,N-diethyl-p-toluidine, or N,N-diisopropyl-p-toluidine. Examples of mercapto compounds are: 2-mercaptobenzimidazole, allylthiourea, and ethylene thiourea. Examples of useful amine/aldehyde condensates are: aniline/butyraldehyde, butylamine/benzaldehyde, and butylamine/benzil. Examples of transition metal compounds are: copper naphthenate, iron naphthenate; cobalt naphthenate, nickel naphthenate, manganese naphthenate; copper octanoate; iron hexanonate, iron propionate; copper oxide, manganese oxide, vanadium oxide, molybdenum dioxide; and vanadium oxide (acetylacetonate)$_2$, and molybdenum oxide (acetylacetonate)$_2$.

The backfill layer or light transmitting layer can have any useful amount of polyfunctional epoxy. In many embodiments the backfill layer or light transmitting layer has 0.1 to 25% wt polyfunctional epoxy. In some embodiments the backfill layer or light transmitting layer has 10 to 20% wt polyfunctional epoxy.

Compatibilizer Molecules

Some molecules can be used to compatibilize the two different phases present in the transfer film. These molecules typically have at least one of each functional group represented from among the two phases. Representative molecules may have one terminal epoxy group and one terminal acrylate group, for example. Examples of these molecules include partially acrylated bisphenol A diglycidyl ether (otherwise known as "CN-153" Sartomer Corp, Exton, Pa.), 2-hydroxybutylglycidyl acrylate ("4-HBAGE" Nippon Kasei Chemical, Tokyo, Japan), glycidyl(meth)acrylate, 3,4-Epoxycyclohexylmethyl methacrylate (sold as "CYCLOMER M100 (Daicel Corp, Osaka, Japan). Rather than having two groups which are chemically similar to the phases in the transfer film, it may also possible for one of the functional groups in the compatibilizer molecule to be able to chemically react with one of the phases in the transfer film. For example, molecules with primary hydroxyl functionality are known to chemically react with epoxide functionalities. Therefore, molecules with terminal hydroxyl functionalities and terminal acrylate functionalities may be used. Examples of these molecules include pentaerythritol tetraacrylate ("SR444" Sartomer, Exton, Pa.).

Other oligomers include acrylated epoxies such as diacrylated esters of epoxy resins, e.g., diacrylated esters of bisphenol A epoxy resin. Examples of commercially available acrylated epoxies include epoxies available under the trade designations "CMD 3500," "CMD 3600," and "CMD 3700," from Radcure Specialties.

Other useful compounds having both epoxy and acrylate functionality, for example, are described in U.S. Pat. No. 4,751,138 (Tumey et al.), which is incorporated herein by reference.

The backfill layer or light transmitting layer can have any useful amount of compatibilizer molecule. In many embodiments the backfill layer or light transmitting layer has 5 to 40% wt compatibilizer molecule. In some embodiments the backfill layer or light transmitting layer has 10 to 35% wt compatibilizer molecule. In other embodiments the backfill layer or light transmitting layer has 15 to 25% wt compatibilizer molecule.

Another way to quantify the amount of compatibilizer molecule in the backfill layer or light transmitting layer by relating to or replacing the epoxy material with compatibilizer material.

The compatibilizer molecule can be from 1 to 100% of the molar equivalent to epoxy material. The compatibilizer molecule can replace the epoxy material on a 1:1 molar ratio.

The backfill layer or light transmitting layer can have any useful amount of polyfunctional acrylate, polyfunctional epoxy, and compatibilizer molecule. In many embodiments the backfill layer or light transmitting layer has 40 to 90% wt polyfunctional acrylate, 1 to 30% wt polyfunctional epoxy, and 5 to 40% wt compatibilizer molecule.

Curing Mechanism

The first multifunctional monomer is cured with a one of, a free-radical or cationic cure mechanism, and the second multifunctional monomer is cured with one of, a free-radical or cationic cure mechanism, that is different and independent from the first multifunctional monomer cure mechanism. The free-radical curing mechanism can be a thermal or photo-radical curing mechanism. The cationic curing mechanism can be a thermal or photo-cationic curing mechanism.

In the case of the free radical curable polyfunctional acrylate component, it is useful to add a free radical initiator to the backfill material, although it should be understood that an electron beam source also could be used to initiate and generate free radicals. The free radical initiator preferably is added in an amount of 0.1 to 3.0% by weight, based on the total amount of resinous components. Examples of useful photoinitiators, that generate a free radical source when exposed to ultraviolet light, include, but are not limited to, organic peroxides, azo compounds, quinones, benzophenones, nitroso compounds, acyl halides, hydrazones, mercapto compounds, pyrylium compounds, triacylimidazoles, acylphosphine oxides, bisimidazoles, chloroalkyltriazines, benzoin ethers, benzil ketals, thioxanthones, and acetophenone derivatives, and mixtures thereof. Examples of photoinitiators that generate a source of free radicals when exposed to visible radiation, are described in U.S. Pat. No. 4,735,632, which description is incorporated herein by reference. A preferred free radical-generating initiator for use with ultraviolet light is an initiator commercially available from Lamberti Corporation (Gallarate-VA-Italy) under the trade designation "ESACURE ONE".

A curing agent to promote polymerization of the epoxy resin can be thermally or photo-activated; that is, the curing agent can be a catalyst activated by actinic radiation (radiation having a wavelength in the ultraviolet or visible portion of the electromagnetic spectrum) or heat. Useful cationic catalysts generate an acid to catalyze the polymerization of an epoxy resin. It should be understood that the term "acid" can include either protic or Lewis acids. These cationic initiators can include a metallocene salt having an onium cation and a halogen containing complex anion of a metal or metalloid. Other useful cationic catalysts include a metallocene salt having an organometallic complex cation and a halogen containing complex anion of a metal or metalloid which are further described in U.S. Pat. No. 4,751,138 (e.g., column 6, line 65 to column 9, line 45), which is incorporated herein by reference. Another example is an organometallic salt and an onium salt described in U.S. Pat. No.

4,985,340 (col. 4, line 65 to col. 14, line 50); European Patent Applications 306,161; 306,162, all incorporated herein by reference. Still other cationic catalysts include an ionic salt of an organometallic complex in which the metal is selected from the elements of Periodic Group IVB, VB, VIB, VIIB and VIIIB which is described in European Patent Application 109,581, which is also incorporated herein by reference. Another example of an onium salt which produces a thermally activated acid which is useful for curing is known as "CXC-1612", an ammonium hexafluoroantimonate salt from King Industries (Norwalk, Conn.).

There are other possible orthogonal curing protocols that could be used in this concept. For example, hydrosilylation between SiH and unsaturated carbon-carbon (alkene, alkyne) can be commonly catalyzed by platinum compounds. Another example is alcoholysis between SiH and SiOH commonly catalyzed by platinum compounds. Another useful example is nucleophilic substitution of SiX by SiOH where X is halogen, oxime, carboxylate, alkoxide, commonly catalyzed by a range of acids or bases, tin and titanium compounds. Free radicals could also be used (e.g. peroxide, UV or e-beam) to initiate a reaction between $SiCH_3$ and $SiCH_3$. All of these are described in Michael Brook, Silicon in Organic, Organometallic and Polymer Chemistry, Wiley Interscience, 2000, pg 282-291.

Latent curative systems can be utilized to cross-link the epoxy moieties as long as the optical and physical properties of the b-stage and c-stage films are met. Latent curative systems which may be useful in the present disclosure include those conventionally used for curing epoxy resin compositions and forming cross-linked polymer networks, including hydrazides such as aminodihydrazide, adipic dihydrazide, isopthalyl dihydrazide; guanidines such as tetramethyl guanidine; and, dicyandiamide.

The amount will vary from resin to resin and is generally to be provided in such an amount as to be effective in causing substantially complete curing within a desired length of time. A typical composition according to the present disclosure includes about 1-10%, by weight of latent hardener based on the total weight of the one-part curable epoxy composition. It will be understood that the final properties of the cured composition will be greatly influenced by the relative amounts of cross-linking and epoxy chain extension caused respectively by the latent hardener.

In some embodiments, the latent curative system has two or more latent accelerators selected from at least one of substituted ureas, substituted imidazoles, and combinations thereof. In some embodiments, the components of the resin miscible first curative can be pre-blended and then added to the heat curable epoxy resin. In some embodiments, the components of the resin miscible first curative can be separately added to the heat curable epoxy resin.

Applications of Transfer Films

The transfer films (or "lamination transfer films") disclosed herein can be used for a variety of purposes. For example, the transfer films can be used to transfer structured layers in OLED (organic light emitting diode) devices to improve efficiency or light extraction of the OLED.

Another exemplary application of the lamination transfer films is for patterning of digital optical elements including microfresnel lenses, diffractive optical elements, holographic optical elements, and other digital optics disclosed in Chapter 2 of B. C. Kress, and P. Meyrueis, *Applied Digital Optics*, Wiley, 2009, on either the internal or external surfaces of display glass, photovoltaic glass elements, LED wafers, silicon wafers, sapphire wafers, architectural glass, metal, nonwovens, paper, or other substrates.

The lamination transfer films can also be used to produce decorative effects on glass surfaces. For example, it might be desirable to impart iridescence to the surface of a decorative crystal facet. In particular, the glass structures can be used in either functional or decorative applications such as transportation glasses, architectural glasses, glass tableware, artwork, display signage, and jewelry or other accessories. Durability of the glass structures may be improved by using the methods disclosed herein to transfer embedded structures. Also, a coating can be applied over these glass structures. This optional coating can be relatively thin in order to avoid adversely affecting the glass structure properties. Examples of such coatings include hydrophilic coatings, hydrophobic coatings, protective coatings, anti-reflection coatings and the like.

Carrier Films

The liner or carrier substrate or film can be implemented with a flexible film providing mechanical support for the transfer film and other layers. One example of a carrier film is polyethylene terephthalate (PET). In some embodiments, the carrier can include paper, release-coated paper, nonwovens, wovens (fabric), metal films, and metal foils.

Various polymeric film substrates comprised of various thermosetting or thermoplastic polymers are suitable for use as the carrier. The carrier may be a single layer or multi-layer film. Illustrative examples of polymers that may be employed as the carrier layer film include (1) fluorinated polymers such as poly(chlorotrifluoroethylene), poly(tetrafluoroethylene-cohexafluoropropylene), poly(tetrafluoroethylene-co-perfluoro(alkyl)vinylether), poly(vinylidene fluoride-cohexafluoropropylene); (2) ionomeric ethylene copolymers poly(ethylene-co-methacrylic acid) with sodium or zinc ions such as SURLYN-8920 Brand and SURLYN-9910 Brand available from E. I. duPont Nemours, Wilmington, Del.; (3) low density polyethylenes such as low density polyethylene; linear low density polyethylene; and very low density polyethylene; plasticized vinyl halide polymers such as plasticized poly(vinychloride); (4) polyethylene copolymers including acid functional polymers such as poly(ethylene-co-acrylic acid) "EAA", poly(ethylene-co-methacrylic acid) "EMA", poly(ethylene-co-maleic acid), and poly(ethylene-co-fumaric acid); acrylic functional polymers such as poly(ethylene-co-alkylacrylates) where the alkyl group is methyl, ethyl, propyl, butyl, et cetera, or $CH_3(CH_2)_n$— where n is 0 to 12, and poly(ethylene-co-vinylacetate) "EVA"; and (5) (e.g.) aliphatic polyurethanes. The carrier layer is typically an olefinic polymeric material, typically comprising at least 50 wt-% of an alkylene having 2 to 8 carbon atoms with ethylene and propylene being most commonly employed. Other body layers include for example poly(ethylene naphthalate), polycarbonate, poly (meth)acrylate (e.g., polymethyl methacrylate or "PMMA"), polyolefins (e.g., polypropylene or "PP"), polyesters (e.g., polyethylene terephthalate or "PET"), polyamides, polyimides, phenolic resins, cellulose diacetate, cellulose triacetate (TAC), polystyrene, styrene-acrylonitrile copolymers, cyclic olefin copolymers, epoxies, and the like.

Receptor Substrates

Examples of receptor substrates include glass such as display mother glass, lighting mother glass, architectural glass, plate glass, roll glass, and flexible glass (can be used in roll to roll processes). An example of flexible roll glass is the WILLOW glass product from Corning Incorporated. Other examples of receptor substrates include metals such as metal sheets and foils. Yet other examples of receptor substrates include sapphire, silicon, silica, and silicon carbide. Yet another example includes fabric, nonwovens, and papers.

Other exemplary receptor substrates include semiconductor materials on a support wafer. The dimensions of these receptor substrates can exceed those of a semiconductor wafer master template. Currently, the largest wafers in production have a diameter of 300 mm. Lamination transfer films produced using the method disclosed herein can be made with a lateral dimension of greater than 1000 mm and a roll length of hundreds of meters. In some embodiments, the receptor substrates can have dimensions of about 620 mm×about 750 mm, of about 680 mm×about 880 mm, of about 1100 mm×about 1300 mm, of about 1300 mm×about 1500 mm, of about 1500 mm×about 1850 mm, of about 1950 mm×about 2250 mm, or about 2200 mm×about 2500 mm, or even larger. For long roll lengths, the lateral dimensions can be greater than about 750 mm, greater than about 880 mm, greater than about 1300 mm, greater than about 1500 mm, greater than about 1850 mm, greater than about 2250 nm, or even greater than about 2500 mm. Typical dimensions have a maximum patterned width of about 1400 mm and a minimum width of about 300 mm. The large dimensions are possible by using a combination of roll-to-roll processing and a cylindrical master template. Films with these dimensions can be used to impart nanostructures over entire large digital displays (e.g., a 55 inch diagonal display, with dimensions of 52 inches wide by 31.4 inches tall).

The receptor substrate can optionally include a buffer layer on a side of the receptor substrate to which a lamination transfer film is applied. Examples of buffer layers are disclosed in U.S. Pat. No. 6,396,079 (Hayashi et al.), which is incorporated herein by reference as if fully set forth. One type of buffer layer is a thin layer of Sift, as disclosed in K. Kondoh et al., *J. of Non-Crystalline Solids* 178 (1994) 189-98 and T-K. Kim et al., *Mat. Res. Soc. Symp. Proc.* Vol. 448 (1997) 419-23.

A particular advantage of the transfer process disclosed herein is the ability to impart structure to receptor surfaces with large surfaces, such as display mother glass or architectural glass. The dimensions of these receptor substrates exceed those of a semiconductor wafer master template. The large dimensions of the lamination transfer films are possible by using a combination of roll-to-roll processing and a cylindrical master template.

An additional advantage of the transfer process disclosed herein is the ability to impart structure to receptor surface that are not planar. The receptor substrate can be curved, bent twisted, or have concave or convex features, due to the flexible format of the transfer tape.

Receptor substrates also may include, automotive glass, sheet glass, flexible electronic substrates such as circuitized flexible film, display backplanes, solar glass, metal, polymers, polymer composites, and fiberglass.

Template Layer

The template layer is the layer that imparts the structure to the backfill layer. It is made up of template materials. The template layer can be formed through embossing, replication processes, extrusion, casting, or surface structuring, for example. The structured surface can include nanostructures, microstructures, or hierarchical structures. In some embodiments, the template layer can be compatible with patterning, actinic patterning, embossing, extruding, and coextruding.

The template layer can include a photocurable material that can have a low viscosity during the replication process and then can be quickly cured to form a permanent cross-linked polymeric network "locking in" the replicated nanostructures, microstructures or hierarchical structures. Any photocurable resins known to those of ordinary skill in the art of photopolymerization can be used for the template layer. The resin used for the template layer must be capable, when crosslinked, of releasing from the backfill layer during the use of the disclosed structured tapes, or should be compatible with application of a release layer (see below) and the process for applying the release layer. Additionally, the resins used for the template layer must be compatible with the application of an adhesion promotion layer as discussed above.

Polymers that can be used as the template layer also include the following: styrene acrylonitrile copolymers; styrene(meth)acrylate copolymers; polymethylmethacrylate; polycarbonate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; cyclic olefin polymers; and copolymers of acrylonitrile, butadiene, and styrene. One preferable polymer is the Lustran SAN Sparkle material available from Ineos ABS (USA) Corporation. Polymers for radiation cured template layers include cross linked acrylates such as multifunctional acrylates or epoxies and acrylated urethanes blended with mono- and multifunctional monomers.

Patterned structured template layers can be formed by depositing a layer of a radiation curable composition onto one surface of a radiation transmissive carrier to provide a layer having an exposed surface, contacting a master with a preformed surface bearing a pattern capable of imparting a three-dimensional microstructure of precisely shaped and located interactive functional discontinuities including distal surface portions and adjacent depressed surface portions into the exposed surface of the layer of radiation curable composition on said carrier under sufficient contact pressure to impart said pattern into said layer, exposing said curable composition to a sufficient level of radiation through the carrier to cure said composition while the layer of radiation curable composition is in contact with the patterned surface of the master. This cast and cure process can be done in a continuous manner using a roll of carrier, depositing a layer of curable material onto the carrier, laminating the curable material against a master tool and curing the curable material against the tool using actinic radiation. The resulting roll of carrier with a patterned, structured template disposed thereon can then be rolled up. This method is disclosed, for example, in U.S. Pat. No. 6,858,253 (Williams et al.).

For extrusion or embossed template layers, the materials making up the template layer can be selected depending on the particular topography of the top structured surface that is to be imparted. In general, the materials are selected such that the structure is fully replicated before the materials solidify. This will depend in part on the temperature at which the material is held during the extrusion process and the temperature of the tool used to impart the top structured surface, as well as on the speed at which extrusion is being carried out. Typically, the extrudable polymer used in the top layer has a $T_g$ of less than about 140° C., or a $T_g$ of from about 85° C. to about 120° C., in order to be amenable to extrusion replication and embossing under most operating conditions. In some embodiments, the carrier film and the template layer can be coextruded at the same time. This embodiment requires at least two layers of coextrusion—a top layer with one polymer and a bottom layer with another polymer. If the top layer comprises a first extrudable polymer, then the first extrudable polymer can have a $T_g$ of less than about 140° C. or a $T_g$ or of from about 85° C. to about 120° C. If the top layer comprises a second extrudable polymer, then the second extrudable polymer, which can function as the carrier layer, has a $T_g$ of less than about 140° C. or a $T_g$ of from about 85° C. to about 120° C. Other properties such as molecular weight and melt viscosity should also be considered and will depend upon the particular polymer or polymers used. The materials used in the template layer should also be selected so that they provide good adhesion to the carrier so that delamination of the two layers is minimized during the lifetime of the transfer film.

The extruded or coextruded template layer can be cast onto a master roll (tool) that can impart patterned structure to the template layer. This can be done batchwise or in a continuous roll-to-roll process. Additionally, a backfill layer can be extruded onto the extruded or coextruded template layer. In some embodiments, all three layers—carrier, template, and backfill layers can be coextruded at once as long as the backfill layer can be separated from the template layer after processing.

Useful polymers that may be used as the template layer polymer include one or more polymers selected from the group consisting of styrene acrylonitrile copolymers; styrene(meth)acrylate copolymers; polymethylmethacrylate; styrene maleic anhydride copolymers; nucleated semi-crystalline polyesters; copolymers of polyethylenenaphthalate; polyimides; polyimide copolymers; polyetherimide; polystyrenes; syndiodactic polystyrene; polyphenylene oxides; and copolymers of acrylonitrile, butadiene, and styrene. Particularly useful polymers that may be used as the first extrudable polymer include styrene acrylonitrile copolymers known as TYRIL copolymers available from Dow Chemical; examples include TYRIL 880 and 125. Other particularly useful polymers that may be used as the template polymer include styrene maleic anhydride copolymer DYLARK 332 and styrene acrylate copolymer NAS 30, both from Nova Chemical. Also useful are polyethylene terephthalate blended with nucleating agents such as magnesium silicate, sodium acetate, or methylenebis(2,4-di-t-butylphenol) acid sodium phosphate.

The template layer may be sacrificial meaning that it will be removed from the construction at a later time as is the template layer disclosed in Applicants' pending application no. 2014/0021492, entitled "STRUCTURED LAMINATION TRANSFER FILMS AND METHODS", filed Jul. 20, 2012. However, the method for making the disclosed transfer tapes and articles made therefrom do not require that the template layer be sacrificial.

Release Layer

The template layer is removed from the backfill layer. One method to reduce the adhesion of the backfill layer to the template layer is to apply a release coating to the film. One method of applying a release coating to the surface of the template layer is with plasma deposition. An oligomer can be used to create a plasma cross-linked release coating. The oligomer may be in liquid or in solid form prior to coating. Typically the oligomer has a molecular weight greater than 1000. Also, the oligomer typically has a molecular weight less than 10,000 so that the oligomer is not too volatile. An oligomer with a molecular weight greater than 10,000 typically may be too non-volatile, causing droplets to form during coating. In one embodiment, the oligomer has a molecular weight greater than 3000 and less than 7000. In another embodiment, the oligomer has a molecular weight greater than 3500 and less than 5500. Typically, the oligomer has the properties of providing a low-friction surface coating. Suitable oligomers include silicone-containing hydrocarbons, reactive silicone containing trialkoxysilanes, aromatic and aliphatic hydrocarbons, fluorochemicals and combinations thereof. For examples, suitable resins include, but are not limited to, dimethylsilicone, hydrocarbon based polyether, fluorochemical polyether, ethylene teterafluoroethylene, and fluorosilicones. Fluorosilane surface chemistry, vacuum deposition, and surface fluorination may also be used to provide a release coating.

Plasma polymerized thin films constitute a separate class of material from conventional polymers. In plasma polymers, the polymerization is random, the degree of cross-linking is extremely high, and the resulting polymer film is very different from the corresponding "conventional" polymer film. Thus, plasma polymers are considered by those skilled in the art to be a uniquely different class of materials and are useful in the disclosed articles.

In addition, there are other ways to apply release coatings to the template layer, including, but not limited to, blooming, coating, coextrusion, spray coating, electrocoating, or dip coating.

Adhesion Promoting Layer Materials

The adhesion promoting layer can be implemented with any material enhancing adhesion of the transfer film to the receptor substrate without substantially adversely affecting the performance of the transfer film. The exemplary materials for the backfill layers can also be used for the adhesion promoting layer. Useful adhesion promoting materials useful in the disclosed articles and methods include photoresists (positive and negative), self-assembled monolayers, silane coupling agents, and macromolecules. In some embodiments, silsesquioxanes can function as adhesion promoting layers. Other exemplary materials may include benzocyclobutanes, polyimides, polyamides, silicones, polysiloxanes, silicone hybrid polymers, (meth)acrylates, and other silanes or macromolecules functionalized with a wide variety of reactive groups such as epoxide, episulfide, vinyl, hydroxyl, allyloxy, (meth)acrylate, isocyanate, cyanoester, acetoxy, (meth)acrylamide, thiol, silanol, carboxylic acid, amino, vinyl ether, phenolic, aldehyde, alkyl halide, cinnamate, azide, aziridine, alkene, carbamates, imide, amide, alkyne, and any derivatives or combinations of these groups. Further, a proprietary silane surface modifier, commercially available from Momentive, Inc (Waterford, N.Y.) under the trade designation "SILQUEST A174", has been found to be particularly suitable.

Release Liners

The backfill layer can, optionally, be covered with a temporary release liner. The release liner can protect the patterned structured backfill during handling and can be easily removed, when desired, for transfer of the structured backfill or part of the structured backfill to a receptor substrate. Exemplary liners useful for the disclosed transfer films are disclosed in PCT Pat. Appl. Publ. No. WO 2012/082536 (Baran et al.).

The liner may be flexible or rigid. Preferably, it is flexible. A suitable liner (preferably, a flexible liner) is typically at least 0.5 mil thick, and typically no more than 20 mils thick. The liner may be a backing with a release coating disposed on its first surface. Optionally, a release coating can be disposed on its second surface. If this backing is used in a transfer article that is in the form of a roll, the second release coating has a lower release value than the first release coating. Suitable materials that can function as a rigid liner include metals, metal alloys, metal-matrix composites, metalized plastics, inorganic glasses and vitrified organic resins, formed ceramics, and polymer matrix reinforced composites.

Exemplary liner materials include paper and polymeric materials. For example, flexible backings include densified Kraft paper (such as those commercially available from Loparex North America, Willowbrook, Ill.), poly-coated paper such as polyethylene coated Kraft paper, and polymeric film. Suitable polymeric films include polyester, polycarbonate, polypropylene, polyethylene, cellulose, polyamide, polyimide, polysilicone, polytetrafluoroethylene, polyethylenephthalate, polyvinylchloride, polycarbonate, or combinations thereof. Nonwoven or woven liners may also be useful. Embodiments with a nonwoven or woven liner could incorporate a release coating. CLEARSIL T50 Release liner; silicone coated 2 mil polyester film liner, available from Solutia/CP Films, Martinsville, Va., and LOPAREX 5100 Release Liner, fluorosilicone-coated 2 mil polyester film liner available from Loparex, Hammond, Wis., are examples of useful release liners.

The release coating of the liner may be a fluorine-containing material, a silicon-containing material, a fluoropolymer, a silicone polymer, or a poly(meth)acrylate ester derived from a monomer comprising an alkyl(meth)acrylate having an alkyl group with 12 to 30 carbon atoms. In one embodiment, the alkyl group can be branched. Illustrative examples of useful fluoropolymers and silicone polymers can be found in U.S. Pat. No. 4,472,480 (Olson), U.S. Pat. Nos. 4,567,073 and 4,614,667 (both Larson et al.). Illustrative examples of a useful poly(meth)acrylate ester can be found in U.S. Pat. Appl. Publ. No. 2005/118352 (Suwa). The removal of the liner shouldn't negatively alter the surface topology of the backfill layer.

Additive Materials

The resin used for the transfer film may contain optional additives in order to improve or maintain performance under a variety of conditions. These may include photoinitiators, polymerization inhibitors, hindered amine light stabilizers, sensitizers, antioxidants, catalysts, dispersants, leveling agents, and the like.

Fillers

The resin used for the transfer film may contain inorganic filler materials to enhance mechanical, thermal, adhesive, or optical performance. For example, silica nanoparticles may be used to enhance the hardness of the resin, without sacrificing the optical transparency. Metal oxide nanoparticles may be used to modify the refractive index of the coating without sacrificing the optical transparency of the resin layer. Examples of these include nanoparticles made from zirconium oxide, titanium oxide, hafnium oxide, and the like. Said nanoparticles may be functionalized with an appropriate ligand in order to enhance compatibility with the resins used in the transfer film. Examples of these may include organoalcohols, carboxylic acids, organosilanes, and the like.

Objects and advantages of this disclosure are further illustrated by the following examples, but the particular materials and amounts thereof recited in these examples, as well as other conditions and details, should not be construed to unduly limit this disclosure.

EXAMPLES

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company, St. Louis, Mo. unless otherwise noted.

TABLE 1

| Glossary | | |
|---|---|---|
| Material Abbreviation | Description | Supplier |
| CELLOXIDE 2021P | (3,4-Epoxycyclohexane) methyl-3,4-epoxycyclohexylcarboxylate | Daicel Corp (Osaka, Japan) |
| UVACURE 1500 | (3,4-Epoxycyclohexane) methyl-3,4-epoxycyclohexylcarboxylate | Allnex Corp. (Smyrna, GA) |
| LA2250 | Poly(methylmethacrylate-block-n-butyl acrylate-block-methylmethacrylate) thermoplastic elastomer | Kurarity Co., Houston, Texas |
| SR833S | tricyclodecane dimethanol diacrylate | Sartomer (Exton, PA) |
| CN-153 | partially acrylated bisphenol A epoxy resin oligomer | Sartomer (Exton, PA) |
| Polyacrylate PSA | 57.5/35/7.5 w/w/w Iso-octylacrylate/methyl acrylate/acrylic acid) as described in Yang et al., US 2005/0276916 A1. | |
| SR368D | 70% Trimethylolpropane triacrylate, 30% tris(2-hydroxy ethyl) isocyanurate triacrylate | Sartomer (Exton, PA) |
| B-CEA | Beta-carboxyethylacrylate | Allnex Corp. (Smyrna, GA) |
| SR9051 | Trifunctional acidic acrylate adhesion promoter | Sartomer (Exton, PA) |
| SILQUEST A174 | Gamma-methacryloxypropyltrimethoxysilane | Momentive Performance Materials (Waterford, NY) |
| SR399 | Dipentaerythritol pentaacrylate | Sartomer (Exton, PA) |
| SR238 | 1,6 hexanediol diacrylate | Sartomer (Exton, PA) |
| TMPTA | Trimethylolpropane triacrylate | Sartomer (Exton, PA) |
| OMAN 071 | p-Octyloxyphenyl)phenyliodonium hexafluoroantimonate | Gelest Inc (Morrisville, PA) |
| TEGORAD 2250 | Silicone acrylate leveling agent | Evonik Corp. (Wallingford, CT) |

TABLE 1-continued

Glossary

| Material Abbreviation | Description | Supplier |
|---|---|---|
| CXC-1612 | ammonium hexafluoroantimonate salt | King Industries (Norwalk, CT) |
| DAROCUR 1173 | 2-Hydroxy-2-methyl-1-phenyl-propan-1-one | BASF (Ludwigshafen, Germany) |
| ESACURE ONE | Difunctional-alpha-hydroxy ketone photoinitiator | Lamberti Corp. (Gallarate-VA-Italy) |

TABLE 2

Resin Formulations (grams)

| Components | CE 1 | CE 2 | Ex. 1 | Ex. 2 |
|---|---|---|---|---|
| CELLOXIDE 2021P | | | 15 | 15 |
| LA2250 | 60 | | | |
| SR833S | 40 | 50 | 60 | 40 |
| CN-153 | | | 20 | 20 |
| Polyacrylate PSA | | 30 | | |
| SR368D | | | | 35 |
| B-CEA | | 20 | | |
| SR9051 | | | 5 | |
| SILQUEST A174 | | | 2 | |
| TEGO RAD 2250 | | | 0.03 | 0.03 |
| CXC-1612 | | | 0.6 | 0.6 |
| DAROCUR 1173 | 1 | 1 | | |
| ESACURE ONE | | | 1 | 1 |
| Methoxypropanol | | | 30 | 30 |
| Toluene | 400 | | | |

Substrate Preparation

Glass slides were rinsed well with acetone and isopropanol and dried with cleanroom wipe. The slides were exposed to an oxygen plasma in a YES G1000 system ($O_2$=60 sccm, time=3 min, RF=300 W) to remove any residual hydrocarbon contamination and expose surface silanol groups. The slides were kept dehydrated in a hot oven >100 C until ready for use, and then placed in a dessicator with 3 drops of 3-methacryloxypropyltrimethoxysilane ("SILQUEST A-174"), which was then placed in an oven at 80 degrees C. for four hours. After removal from the dessicator, a change in the water contact angle was observed, signifying deposition of a monolayer of the silane. Any silane that was not covalently bound to the glass slide was washed away with acetone and isopropanol. Example #1 did not require the SILQUEST A-174 adhesion promoter deposited on a glass slide.

Template/Microstructured Release Liner Preparation

The base film was 2-mil PET, primed with a UV cured primer comprising 50/50 blend of UVACURE 1500 and TMPTA with 1% OMAN 071 photoinitiator. The replicating resin was a 75/25 blend of SR 399 and SR238 with a photoinitiator package comprising 1% Darocur 1173, 1.9% triethanolamine, 0.5% OMAN 071, and 0.3% methylene blue. Replication of the resin was conducted at 20 fpm with the tool temperature at 137 deg F. Radiation from a Fusion "D" lamp operating at 600 W/in was transmitted through the film to cure the resin while in contact with the tool. The composite film was removed from the tool and the patterned side of the film was post UV cured using a Fusion "D" lamp operating at 360 W/in while in contact with a chill roll heated to 100 deg F. The microstructure contained an optical diffraction pattern that had multiple pitches (400, 500, and 600 nm).

The replicated template film was primed with argon gas at a flow rate of 250 standard cc/min (SCCM), a pressure of 25 mTorr and RF power of 1000 Watts for 30 seconds. Subsequently, the samples were exposed to tetramethylsilane (TMS) plasma at a TMS flow rate of 150 SCCM but no added oxygen; this corresponds to an atomic ratio of oxygen to silicon of about 0. The pressure in the chamber was 25 mTorr, and the RF power of 1000 Watts was used for 10 seconds.

Resin Processing, Lamination and Curing

The resin formulations shown above in Table 2 were added to a polypropylene cup and mixed for 30 sec at 2500 rpm until homogenous in a Speed Mixer (Flacktek, Landrum, S.C.). The formulations were coated using a notch bar with a 5 mil gap on a microstructured release liner described above. The films were dried at 120° C. for four minutes in an oven until the film formed a tacky gel. Sections of the film were cut out and laminated to glass slides with a hand roller, pre-baked at 60° C. in a convection oven for 30 minutes to build adhesion, and then UV cured with a Fusion H Bulb, 300 W/in intensity 2 passes at 30 feet/min. The glass/film tool stack was placed back in the oven at 120° C. for a post thermal bake to complete the curing process, then the microstructured release tool was removed, leaving behind the inverted pattern of microstructured tooling film on the substrate.

Test Methods

Test Method 1: Transmission, Haze and Clarity

The measurement of average % transmission, haze and clarity was conducted with a haze meter (BYK Gardiner, under the trade designation "BYK Hazegard Plus, Columbia, Md.") based on ASTM D1003-11.

Test Method 2: Microstructure Thermal Stability Test

After peeling the nanostructured tooling film, the fully cured nanostructures adhere to the substrate form an optical diffraction pattern that can be viewed with the naked eye. The glass slides were placed on a hotplate under nitrogen set at 100° C. for 15 minutes. Pictures of the glass slide were taken before and after the test and the optical diffraction pattern of each was compared side by side. If no change was observed in the optical diffraction of the nanostructures after all these tests, the resin formulation was considered to "Pass." If the sample passed, the same procedure was followed with the same sample, except the heating was performed up to 230° C.

Test Method 3: Peel Adhesion

Peel adhesion is the force required to remove a coated flexible sheet of material from a test panel measured at a specific angle and rate of removal. Isopropyl alcohol was used to clean the glass prior to film application. The samples were cut into 1" wide strips. After lamination and prior to testing, the samples were equilibrated at a room temperature, 23° C. and relative humidity of 50%, for 15 minutes. Peel adhesion was measured as a 180 degree peel back at a crosshead speed of 12 in/min using IMASS 2100 Slip/Peel Tester (IMASS, Inc., Accord, Mass.). The peel adhesion force is reported as an average of three replicates, in ounces per inch.

Test Method 4: Parallel Plate Rheometer

Resin formulations were coated using a notch-bar at 5 mil dry thickness on a release liner, and then cured at 120 C as described above. Multiple handspreads were then laminated on top of themselves in order to achieve a dry thickness of 30 mil. A TA Instruments (New Castle, Del.) Discovery Hybrid Rheometer was run from −65 to 170° C. at 1 rad/sec with the adhesive in between 8 mm diameter parallel plates.

Test Method 5: Glass Transition Temperature

All examples and comparative examples were cured to the C-stage using ultraviolet radiation in a Fusion UV processor (Hereus, Gaithersburg, Md.) using a H-bulb and an exposure dose of 1 J/cm$^2$.

To measure the glass transition temperature, the cured films were cut to 5 mm width and clamped into TA Instruments Q800 Dynamic Mechanical Analyzer (DMA). The experiment was run in tension mode at a temperature range from 0° C. to 250° C. at a strain amplitude 5 micrometers, a frequency of 1 Hz, and a heating rate of 2° C./min. The glass transition temperature was defined by the peak of the tan delta curve.

Test Method 6: Thermal Decomposition Temperature

Pieces of the fully cured resins (about 2 mg each) were placed in a tared aluminum pan inside a Q500 Thermogravimetric Analyzer from TA Instruments (New Castle, Del.). The heating rate selected was 10° C./min up to 550° C. The decomposition temperature was defined as the temperature at which the resin has decomposed to 95% of its original weight.

Results

Comparative Example 1 and 2 were prepared using linear thermoplastic polymers in combination with multifunctional acrylate tackifiers. These were compared to Example 1 and Example 2, which use a crosslinked epoxy in combination with multifunctional acrylate tackifiers and adhesion promoters. Tests were performed to check for adhesive properties in the films' B-stage and high temperature performance at the films' C-stage.

Initial screening was performed using thermal stability tests described above in Test Method #2. Optical diffraction from the microstructure was observed to disappear after 100° C. for 15 minutes in Comparative Example 1. This resin was excluded from future processing and analysis. Comparative Example #2 passed the 100 C thermal stability bake test, but failed the 230° C. thermal stability test. Examples 1 and 2 passed both tests and were evaluated further.

TABLE 3

Microstructure Thermal Stability Results

|  | CE1 | CE2 | E1 | E2 |
|---|---|---|---|---|
| 100° C. Microstructure Thermal Stability | Fail | Pass | Pass | Pass |
| 230° C. Microstructure Thermal Stability | Fail | Fail | Pass | Pass |

Transmission and Haze Measurements, Glass Transition Temperature and Thermal

Decomposition Temperature analysis was performed of the fully cured resin samples that passed the 100° C. Microstructure Thermal Stability Test. Results are shown in Table 4. All resin formulations showed a high transmission and low haze. A major difference between these resin formulations is their thermal decomposition temperature. CE1, using a thermoplastic component, begins to decompose at 215° C. and the optical diffraction resulting from the microstructures completely disappeared by 230° C. E1 and E2 both have decomposition temperatures greater than 300° C. The high decomposition temperature in combination with glass transition temperatures greater than 150° C. lead to enhanced high temperature structural performance. CE2 shows two glass transition temperatures, one at 2 degrees C. and a second at 168 degrees C., thus CE2 has at least one glass transition temperature of less than 150 degrees centigrade.

TABLE 4

C-Stage Resin Properties

|  | CE2 | E1 | E2 |
|---|---|---|---|
| Transmission (% T) | 93.4 | 93.4 | 93.3 |
| Haze (%) | 0.90 | 0.47 | 0.67 |
| Decomposition Temperature at 5% Weight Loss (TGA, ° C.) | 215 | 315 | 350 |
| Glass Transition Temperature (° C.) | 2 and 168 | 197 | 165 |

Table 5 shows the Peel Adhesion, Glass Transition Temperature and Parallel Plate Rheometer Test results of the B-staged films. The results show that E1 and E2 have higher storage modulus and also higher glass transition temperature values (above 150 degrees C.), compared to CE2. E1 and E2 also had lower peel adhesion values than CE2. However, it was surprising that E1 and E2 were able to have the combination of the adhesive properties when partially cured to enable wet-out on the receptor substrate, and maintaining high temperature structural performance when fully cured on the substrate and removed from the tooling film mold.

TABLE 5

B-Stage resin properties

|  | CE2 | E1 | E2 |
|---|---|---|---|
| Storage Modulus G' at 25 C., 1 Hz (Pa) | 3535 | 40059 | 37705 |
| Glass Transition Temperature (Tg) (° C.) | −50 | −16 | −15 |
| Peel Adhesion ((oz/inch) | 1.85 ± 1.5 | 0.37 ± 0.02 | 1.64 ± 0.15 |

Thus, embodiments of DUAL-CURE NANOSTRUCTURE TRANSFER FILM are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A transfer film comprising:
a template layer having a first major surface and an opposing second major surface, the second major surface comprising a structured non-planar release surface; and
a backfill layer disposed upon and conforming to the non-planar structured surface, the backfill layer comprising a thermal cationically cured layer prepared as follows:
preparing a mixture comprising:
about 0.1 to about 20 wt-% of an epoxy curable by a first curing mechanism comprising thermal cationic curing;
about 60 to about 90 wt-% of multifunctional acrylate monomers curable with a second curing mechanism different from the first curing mechanism, the multifunctional acrylate monomers selected from the group consisting of ethylene glycol diacrylate, ethylene glycol dimethacrylate, hexanediol diacrylate, triethylene glycol diacrylate, trimethylolpropane triacrylate, ethoxylated trimethylolpropane triacrylate, glycerol triacrylate, pentaerthyitol triacrylate, pentaerythritol trimethacrylate, pentaerythritol tetraacrylate, pentaerythritol tetramethacrylate, neopentylglycol diacrylate, cycloaliphatic multifunctional (meth) acrylates, and combinations thereof; and
about 5 to about 40 wt-% of a compatibilizer comprising molecules with acrylate functional groups and epoxy functional groups;
curing the mixture by thermal cationic curing,
wherein at least some of the epoxy functional groups of the epoxy and at least some of the epoxy functional groups of the compatibilizer are cured by thermal cationic curing to form a network of cross-linked epoxy having dispersed therein the multifunctional acrylate monomers, thereby forming the thermal cationically cured layer; and
wherein the backfill layer forms a pressure sensitive adhesive at room temperature.

2. The transfer film according to claim 1, wherein the backfill layer includes a free radical photoinitiator to cure the multifunctional acrylate monomers via a photo free radical mechanism.

3. The transfer film according to claim 1, wherein the backfill layer has a glass transition temperature value that is less than 25 degrees centigrade.

4. The transfer film according to claim 1, wherein the epoxy comprises cycloaliphatic multifunctional epoxy monomers.

5. The transfer film according to claim 1, wherein the multifunctional acrylate monomers are curable via a free-radical mechanism.

6. The transfer film according to claim 1, further comprising a release liner disposed on a planar major surface of the back fill layer wherein the backfill layer is between the release liner and the structured non-planar release surface.

7. The transfer film according to claim 1, wherein the backfill layer has an elastic modulus of less than $0.3 \times 10^5$ Pa.

8. An article comprising:
the transfer film according to claim 1 disposed on a receptor substrate.

9. The article according to claim 8, wherein the receptor substrate comprises glass or sapphire.

10. The article according to claim 8, wherein the receptor substrate comprises an organic light emitting diode color filter element.

11. An article comprising:
a receptor substrate having a receptor surface;
a light transmission layer having a first major surface adhered to the receptor surface and an opposing second major surface having a structured non-planar surface, the light transmission layer comprising an interpenetrating network prepared as follows:
preparing a mixture comprising:
about 0.1 to about 20 wt-% of an epoxy curable by a first curing mechanism comprising thermal cationic curing;
about 60 to about 90 wt-% of multifunctional acrylate monomers curable with a second curing mechanism different from the first curing mechanism, the multifunctional acrylate monomers selected from the group consisting of ethylene glycol diacrylate, ethylene glycol dimethacrylate, hexanediol diacrylate, triethylene glycol diacrylate, trimethylolpropane triacrylate, ethoxylated trimethylolpropane triacrylate, glycerol triacrylate, pentaerthyitol triacrylate, pentaerythritol trimethacrylate, pentaerythritol tetraacrylate, pentaerythritol tetramethacrylate, neopentylglycol diacrylate, cycloaliphatic multifunctional (meth) acrylates, and combinations thereof; and
about 5 to about 40 wt-% of a compatibilizer comprising molecules with acrylate functional groups and epoxy functional groups;
curing the mixture by thermal cationic curing:
wherein at least some of the epoxy functional groups of the epoxy and at least some of the epoxy functional groups of the compatibilizer are cured by thermal cationic curing to form a network of cross-linked epoxy having dispersed therein the multifunctional acrylate monomers, thereby forming a partially cured layer; and
curing the partially cured layer by free radical curing:
wherein at least some of the acrylate functional groups of the multifunctional acrylate monomers and at least some of the acrylate functional groups of the compatibilizer are cured by the free radical curing to form a cross-linked acrylate, and
wherein the cross-linked epoxy produced by the thermal cationic curing and the cross-linked acrylate produced by the free radical curing form the interpenetrating network of the light transmission layer; and
wherein the light transmission layer has a haze value of less than 2% and a visible light transmission greater than 85% and a decomposition temperature greater than 250 degrees centigrade.

12. The article according to claim 11, wherein the epoxy polymer comprises multifunctional cycloaliphatic epoxy monomers.

13. The article according to claim 11, wherein the receptor substrate comprises an organic light emitting diode color filter element.

14. A transfer film comprising:
a template layer having a first major surface and an opposing second major surface, the second major surface comprising a structured non-planar release surface; and a backfill layer disposed upon and conforming to the non-planar structured surface, the backfill layer comprising a thermal cationically cured layer prepared as follows:

preparing a mixture comprising:

about 0.1 to about 15 wt-% of an epoxy curable by a first curing mechanism comprising thermal cationic curing;

about 60 to about 90 wt-% of multifunctional acrylate monomers curable with a second curing mechanism different from the first curing mechanism; and about 5 to about 40 wt-% of a compatibilizer comprising molecules with acrylate functional groups and epoxy functional groups;

curing the mixture by thermal cationic curing, wherein at least some of the epoxy functional groups of the epoxy and at least some of the epoxy functional groups of the compatibilizer are cured by thermal cationic curing to form a network of cross-linked epoxy having dispersed therein the multifunctional acrylate monomers, thereby forming the thermal cationically cured layer; and wherein the backfill layer forms a pressure sensitive adhesive at room temperature.

15. A transfer film comprising:

a template layer having a first major surface and an opposing second major surface, the second major surface comprising a structured non-planar release surface; and a backfill layer disposed upon and conforming to the non-planar structured surface, the backfill layer comprising a thermal cationically cured layer prepared as follows:

preparing a mixture comprising:

about 0.1 to about 20 wt-% of an epoxy curable by a first curing mechanism comprising thermal cationic curing;

about 70 to about 90 wt-% of multifunctional acrylate monomers curable with a second curing mechanism different from the first curing mechanism; and about 5 to about 40 wt-% of a compatibilizer comprising molecules with acrylate functional groups and epoxy functional groups;

curing the mixture by thermal cationic curing, wherein at least some of the epoxy functional groups of the epoxy and at least some of the epoxy functional groups of the compatibilizer are cured by thermal cationic curing to form a network of cross-linked epoxy having dispersed therein the multifunctional acrylate monomers, thereby forming the thermal canonically cured layer; and wherein the backfill layer forms a pressure sensitive adhesive at room temperature.

* * * * *

UNITED STATES PATENT AND TRADEMARK OFFICE
CERTIFICATE OF CORRECTION

PATENT NO. : 10,106,643 B2
APPLICATION NO. : 14/674819
DATED : October 23, 2018
INVENTOR(S) : Schwartz et al.

It is certified that error appears in the above-identified patent and that said Letters Patent is hereby corrected as shown below:

In the Specification

Column 7
Line 15 (Approx.), Delete "pentaerthyitol" and insert -- pentaerythritol --, therefor.

Column 8
Line 5 (Approx.), Delete "methycyclohexane" and insert -- methylcyclohexane --, therefor.

Column 9
Line 21, Delete "hexanonate," and insert -- hexanoate, --, therefor.

Column 11
Line 33, Delete "isopthalyl" and insert -- isophthalyl --, therefor.

Column 12
Line 40, Delete "poly(vinychloride);" and insert -- poly(vinylchloride); --, therefor.

Column 14
Line 18, Delete "syndiodactic" insert -- syndiotactic --.

Column 15
Line 27, Delete "syndiodactic" and insert -- syndiotactic --.

Column 16
Line 4-5, Delete "teterafluoroethylene," and insert -- tetrafluoroethylene, --, therefor.

Column 17
Line 12 (Approx.), Delete "CLEARSIL" and insert -- CLEARASIL --, therefor.

Signed and Sealed this
Eighth Day of October, 2019

Andrei Iancu
*Director of the United States Patent and Trademark Office*

Column 19
Line 40 (Approx.), Delete "dessicator" and insert -- desiccator --, therefor.

Column 19
Line 44 (Approx.), Delete "dessicator," and insert -- desiccator, --, therefor.

Column 19
Line 56, Delete "photoinitator" and insert -- photoinitiator --, therefor.

Column 20
Line 43, Delete "Gardiner," insert -- Gardner, --.

Column 21
Line 17 (Approx.), Delete "(Hereus," and insert -- (Heraeus, --, therefor.

In the Claims

Column 23
Line 25, In Claim 1, Delete "pentaerthyitol" and insert -- pentaerythritol --, therefor.

Column 24
Line 25, In Claim 11, Delete "pentaerthyitol" and insert -- pentaerythritol --, therefor.

Column 24
Line 44, In Claim 11, Delete "multifuctional" and insert -- multifunctional --, therefor.

Column 26
Line 25, In Claim 15, Delete "canonically" insert -- cationically --.